(12) United States Patent
Parker et al.

(10) Patent No.: US 6,630,715 B2
(45) Date of Patent: Oct. 7, 2003

(54) ASYMMETRICAL MOSFET LAYOUT FOR HIGH CURRENTS AND HIGH SPEED OPERATION

(75) Inventors: Scott M. Parker, Jericho, VT (US); Steven J. Tanghe, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/968,219

(22) Filed: Oct. 1, 2001

(65) Prior Publication Data

US 2003/0064574 A1 Apr. 3, 2003

(51) Int. Cl.[7] ................................................ H01L 23/62
(52) U.S. Cl. ........................................ 257/357; 257/386
(58) Field of Search .................................. 257/328, 356, 257/357, 386, 389, 762, 286, 407, 411

(56) References Cited

U.S. PATENT DOCUMENTS 5,468,984 A * 11/1995 Efland et al.

* cited by examiner

*Primary Examiner*—Phuc T. Dang
(74) *Attorney, Agent, or Firm*—McGinn & Gibb, PLLC; Richard A. Henkler, Esq.

(57) ABSTRACT

A structure and method for a field effect transistor capable of handling high currents, comprises interleaved source and drain diffusion regions with drain diffusion contacts to a first metal level over the drain diffusions only; while a second metal level covers the full width of the device and takes current out of the source in a primarily vertical direction.

16 Claims, 4 Drawing Sheets

ASYMMETRICAL MOSFET LAYOUT FOR HIGH CURRENTS AND HIGH SPEED OPERATION

BACKGROUND OF THE INVENTION

1. Field of the Invention

The present invention generally relates to integrated circuit designs, and more particularly to a field effect transistor device capable of handling high currents and implemented for high-speed operation.

2. Description of the Related Art

As integrated circuit dimensions continue to shrink and operational speeds increase, electromigration of on-chip metal becomes more difficult to manage. Field effect transistors (FETs) can carry a lot of current in high-speed applications and, as such, it is becoming a more frequent result that the metal coverage of the small devices is not ample enough to ensure reliable operation.

Conventional systems typically utilize a large number of field effect transistors elements integrated in a semiconductor chip. It is well known that each FET element includes a source, a drain, and a gate. Typically, the gate, drain, and source diffusions of FETs are wired up on one or two levels of metal as determined by the connectivity requirements of the circuit being built.

The peak drain/source current (Ids) flowing through a very wide and very short (large W/L ratio) FET will violate metal current density rules if the diffusions are contacted laterally using narrow strips of M1 metal. Increasing the widths of these strips necessitates an increase in source/drain diffusion width, which in turn increases the parasitic capacitance on these nodes.

A standard field effect transistor device layout 1 is shown in FIG. 1, wherein the width of M1 metal 10 has been increased to handle the lateral flow of current through the M1 metal 10 and into the drain diffusions that are not directly below the M2 metal 11 that supplies the drain with current.

The width of the M1 metal 9 that carries current laterally out of the source diffusions to M2 metal 16 is also increased from its minimum value. The polysilicon gate region 12 is further shown along with the M1–M2 contacts 15 and the diffusion-M1 contacts 14 dispersed along the length of the channels defined by the intersection of diffusion region 13 and polysilicon gate region 12.

The source and drain diffusions that are under the M1 metal 9 and M1 metal 10 are also widened to handle the extra metal. In this conventional layout, the M2 metal 11 connection to the drain and M2 metal 16 connection to the source are arranged parallel to each other but perpendicular to the channel formed by the diffusion region 13 and polysilicon gate region 12

The source and drain diffusions 17, 18 are defined by the portions of diffusion region 13 that are not intersected with the polysilicon gate region 12. The drawbacks of this conventional device are several. For example, the widening of these diffusions 17, 18 to handle the increased lateral current increases the capacitance and can slow the performance of the device. Moreover, this lateral flow of current through the source and drain diffusions 17, 18 increases the resistance in series with both the drain and source of the device. This increased resistance also decreases the performance of the device.

A second device 2 and technique that can be used is to break the drain M2 metal 20 and source M2 metal 21 into interdigitated strips, is shown in FIG. 2. In this manner, the current does not flow very far laterally before being channeled up through a contact to M2 metal (20 or 21). The source and drain diffusions 27, 28 are defined by the portions of diffusion region 23 that are not intersected with the polysilicon gate region 22. The polysilicon gate region 22 is further shown along with the M1–M2 contacts 25 and the diffusion-M1 contacts 24 dispersed along the length of the channels defined by the intersection of diffusion region 23 and polysilicon gate region 22. The problem with this approach is that the spacing requirements between drain M2 metal 20 and source M2 metal 21 strips is large enough such that it utilizes valuable space needed by the M2 metal to carry high currents without having electromigration problems.

In other prior art devices, various configurations of field effect transistors are described, such as those disclosed in U.S. Pat. No. 5,625,207 (teaching a power transistor formed of many parallel FET elements where the element source and drain electrodes are at the same level, while the component electrodes are one level of metal higher with current from the elements flowing vertically up into the component electrodes); U.S. Pat. No. 5,750,416 (teaches a power FET where the current flows laterally through the device then vertically through the substrate to the drain electrode, thus the device is double diffused but not in the channel region); U.S. Pat. No. 5,844,277 (teaches a double diffused power MOSFET); U.S. Pat. No. 6,066,877 (teaches a vertical power MOSFET with low on resistance, with a thick metal layer lying on top of the transistors contact metal); U.S. Pat. No. 6,159,841 (teaches an interdigitated power MOSFET with low resistance, with thick uniform level metal interconnects); Japanese Patent Number JP9064063 (teaches a power FET with the gate electrodes perpendicular to the plane of the active areas); and European Patent Number EP1096573A2 (teaches a power FET with a reduced gate-to-drain capacitance by etching that portion of the polysilicon gate region, which overlaps the drain); the complete disclosures of which are herein incorporated by reference. However, one important characteristic absent from all the prior art devices is that the configuration of the interdigitated source and drain diffusions does not provide a method by which the current flow through the drain/source is maximized while at the same time the capacitive loading on the drain diffusion is minimized. By failing to provide for this optimize the device configuration for this combined effect, the maximum possible device performance in all of the prior art devices is not achieved. Thus, there is a need for a field effect transistor capable of handling high currents and operating at high speeds, which reduces the overall capacitance in the drain or source of the device and maximizes the current flow through the device, thereby increasing device performance.

SUMMARY OF THE INVENTION

In view of the foregoing and other problems, disadvantages, and drawbacks of the conventional field effect transistor devices, the present invention has been devised, and it is an object of the present invention to provide a structure and method for a field effect transistor capable of handling high currents and adapted for high-speed operation. It is another object of the present invention to provide a field effect transistor device, which results in higher device performance. It is yet another object of the present invention to provide a field effect transistor device which reduces lateral current flow in the first level of metal used to connect to the drain or source of a device, thereby improving the metal electromigration problems.

In order to attain the objects suggested above, there is provided, according to one aspect of the invention, a field effect transistor comprising interleaved source and drain diffusion regions with a plurality of drain diffusion contacts to a first metal level over the drain diffusions only; while a second metal level covers the full width of the device and takes current out of the source in a substantially vertical direction. Alternately, the field effect transistor comprises interleaved source and drain diffusion regions with a plurality of source diffusion contacts to a first metal level over the source diffusions only; while a second metal level covers the full width of the device and takes current out of the drain in a substantially vertical direction.

The drain, gate, and source of the multi-finger field effect transistor are fabricated using the process steps consistent with a standard MOSFET process. The source regions are defined to be the minimum length allowable by technology ground rules. The drain regions are defined to be the length necessary to contain two or more rows of Diffusion-M1 contacts. The polysilicon gate regions are defined to have equal finger widths.

Other features of the device are that the second metal covers a full width or nearly the full width of the field effect transistor. Moreover, the source diffusion region has a minimum length and the second metal removes current out of the source region in a substantially vertical direction. Furthermore, the drain current is carried from the drain diffusion region in a substantially lateral direction on a first level of metal having greater than minimum length to protect against electromigration in that region. Alternatively, the source current is carried from the source diffusion region in a substantially lateral direction on a first level of metal having greater than minimum length to protect against electromigration in that region.

Also, the drain region comprises a plurality of drain diffusion contacts to a first metal level over the drain region only. Additionally, the source region has a capacitance lower than the drain region. Alternately, the source region comprises a plurality of source diffusion contacts to a first metal level over the drain region only and the drain region has a capacitance lower than the source region.

In the device, one of the diffusions is chosen as the low capacitance, low resistance path up to the M2 level. This is shown as the narrower diffusion and has minimum capacitance associated with it. Here, the current feeds straight up into the M2 lead with very little lateral flow, thereby reducing the risk of metal electromigration and hence increasing the current carrying capacity of the device. Also, the M2 that does collect the current can be configured to encompass the full width of the device. These novel elements make this design excellent for electromigration reliability. The other diffusion is considered sacrificial in the sense that the M1 must be fattened extensively to handle the large lateral flow of current off to the side of the device. However, in most circuit designs, such as the prior art devices shown in FIGS. 1 and 2, there is usually a node, either source or drain, that does not need to be fast. Another benefit of the present device is the reduction of the metal resistance from the source (or drain) diffusion area to the metal 2.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF PREFERRED EMBODIMENTS OF THE INVENTION

As previously mentioned, there is a need for a novel field effect transistor device capable of handling high currents and adapted for high-speed operation. Moreover, as stated above, as integrated circuit dimensions continue to shrink and operational speeds increase, electromigration of on-chip metal becomes more difficult to manage. Field effect transistors tend to carry a lot of current in high-speed applications and, as such, it is becoming a more frequent problem that the metal coverage of the small devices is not ample enough to ensure reliable operation.

In response to this need, the present invention describes a layout pattern and technique that allows for high currents in field effect transistors without a sacrifice in device performance. What is disclosed is a field effect transistor comprising a drain comprising a first diffusion region and a first metal; a source comprising a second diffusion region and a second metal, wherein the source is larger in size than the drain; and a source connection comprising a third metal connected to the second metal, wherein the third metal is dimensioned to cover a width of the field effect transistor. The third metal takes current out of the source in a substantially vertical direction, wherein the vertical direction is a direction perpendicular to a plane of the second metal. Moreover, current flows from the source in a substantially lateral direction, wherein the lateral direction is a direction parallel to a plane of the second metal. Alternatively, a current flows from the drain in a substantially lateral direction, wherein the lateral direction is a direction parallel to a plane of the first metal. Furthermore, the source further comprises a plurality of source diffusion contacts to the first metal, wherein the drain diffusion contacts are over the source only. Also, the source has a capacitance that is lower than that of the drain.

Figure 3:
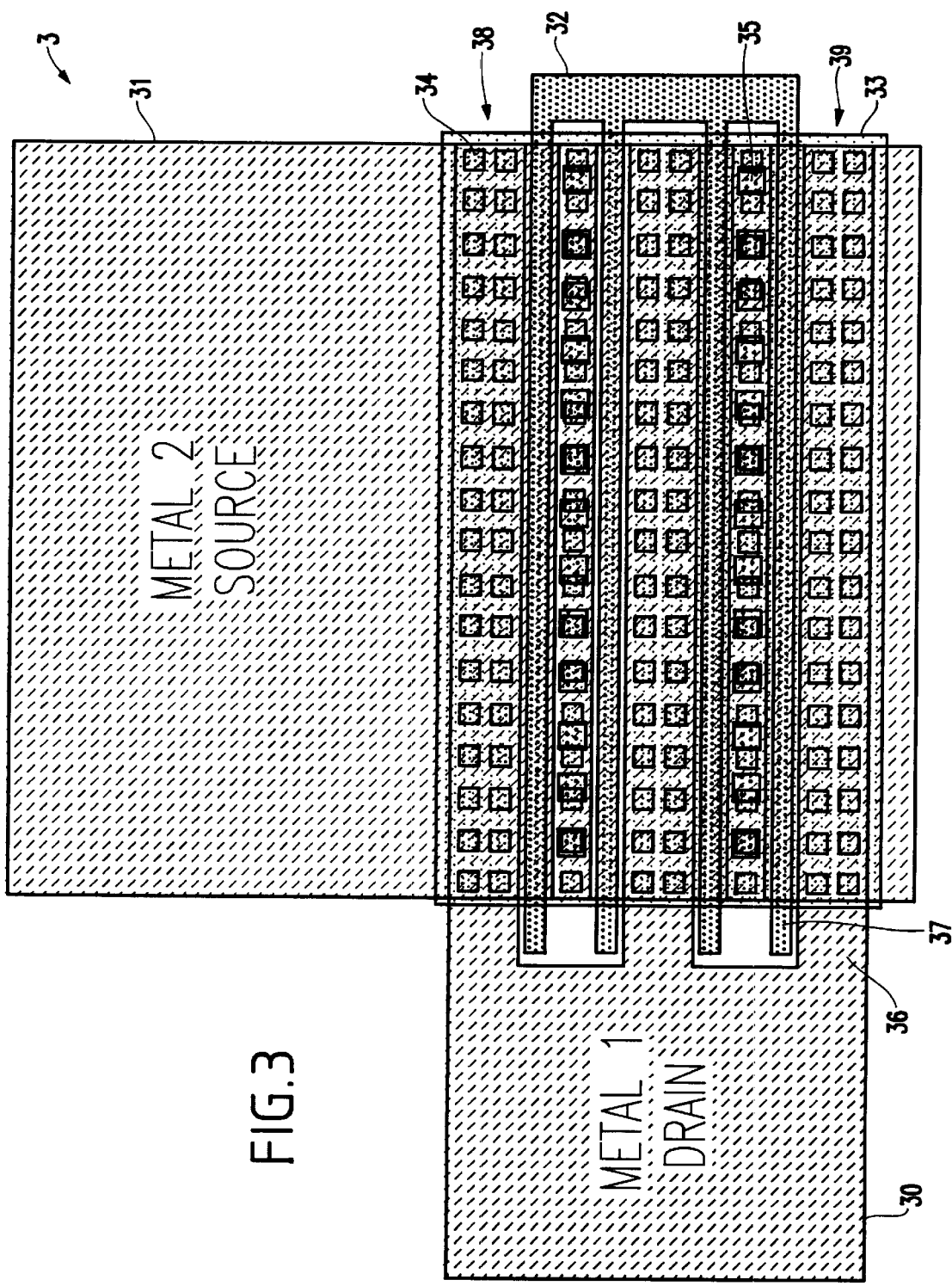
FIG. 3 is a schematic diagram of a field effect transistor according to the present invention.

Referring now to the drawings, and more particularly to FIG. 3, there are shown preferred embodiments of the structure according to the present invention. In the preferred embodiment, a field effect transistor device 3 is shown comprising a drain 30 connection (embodied as an M1 metal), a source 31 connection (embodied as an M2 metal), a polysilicon gate region 32, a diffusion region 33, with an M1–M2 contact 35 and a diffusion-M1 contact 34 arranged therein. The source and drain diffusions 38, 39 are defined by the portions of diffusion region 33 that are not intersected with the polysilicon gate region 32.

The field effect transistor 3 comprises interleaved drain diffusion regions with drain diffusion contacts 34 to a first metal level 30 over the drain diffusions only; while the second metal level 31 covers the full width of the device and takes current out of the source in a primarily vertical direction. The M1 drain metal level 30 comprises multiple finger like projections 36. The drain metal contacts the drain diffusions through diffusion-M1 contacts 34. The M2 source metal level 31 comprises a rectangular metal shape that covers the entire width of the device or nearly the entire width. The source metal contacts the source diffusions through the diffusion-M1–M2 contact stack 35. The polysilicon gate region 32 also comprises finger like projections 37.

Figure 4:
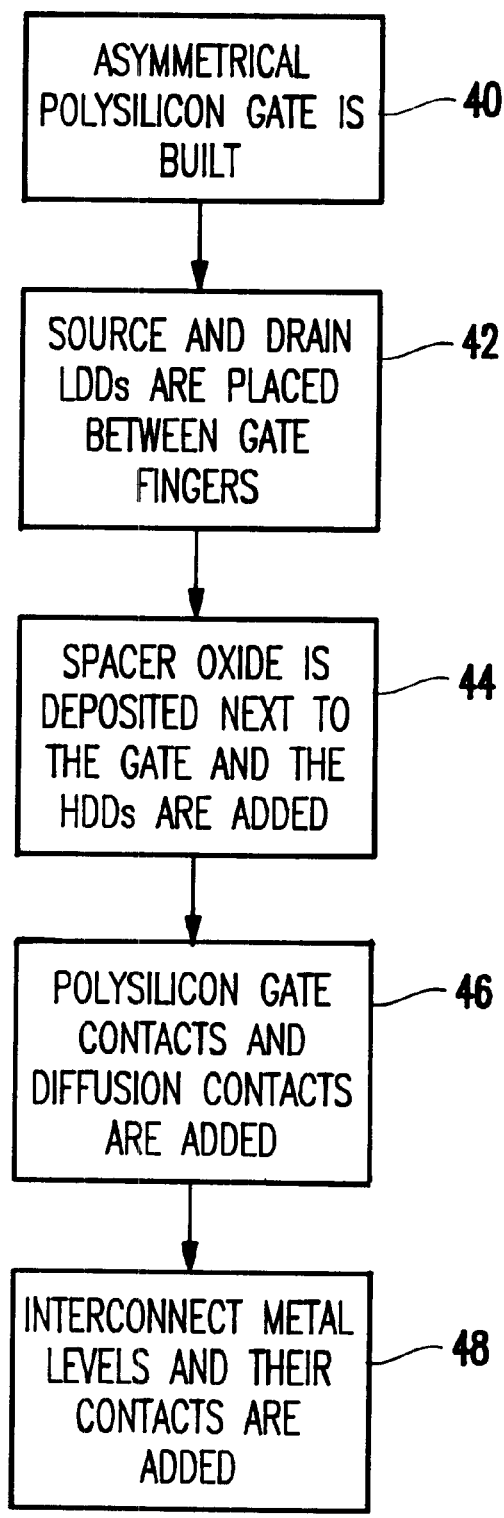
FIG. 4 is a flow diagram illustrating a preferred method of the invention.

The general method of forming such a device 3 is illustrated in FIG. 4. First, the polysilicon gate is deposited 40 on the wafer. The different length source and drain diffusions are defined by making the interdigitated fingers on this mask in an asymmetrical fashion. Next, the lightly doped diffusions (LDD) representing the sources and drains are implanted/diffused 42 in the regions between the gate blocking layer. Then, an oxide space is placed 44 on each side of the polysilicon gate blocking layer. Here, an oxide space is placed on each side of the polysilicon gate and the highly doped diffusions (HDD) are implanted. This completes the formation of the "basic" intrinsic FET. Finally, the diffusion and polysilicon contacts are built 46 and then the interconnect wiring and their associated vias contacts are added 48.

Other features of the device 3 are that the second metal 31 covers a full width or nearly the full width of the field effect transistor 3. Furthermore, the drain current is carried from the drain diffusion region (38 or 39) in a substantially lateral direction on a first level of metal having greater than minimum length to protect against electromigration in that region. Alternatively, the source current is carried from the source diffusion region (38 or 39) in a substantially lateral direction on a first level of metal having greater than minimum length to protect against electromigration in that region.

Also, the drain region (38 or 39) comprises a plurality of drain diffusion contacts 34 to a first metal level over the drain region only 30. Additionally, the source region (38 or 39) has a capacitance lower than the drain region (38 or 39). Alternately, the source region (38 or 39) comprises a plurality of source diffusion contacts 35 to a first metal level over the source region only 30 and the drain region (38 or 39) has a capacitance lower than the source region (38 or 39).

Figure 1:
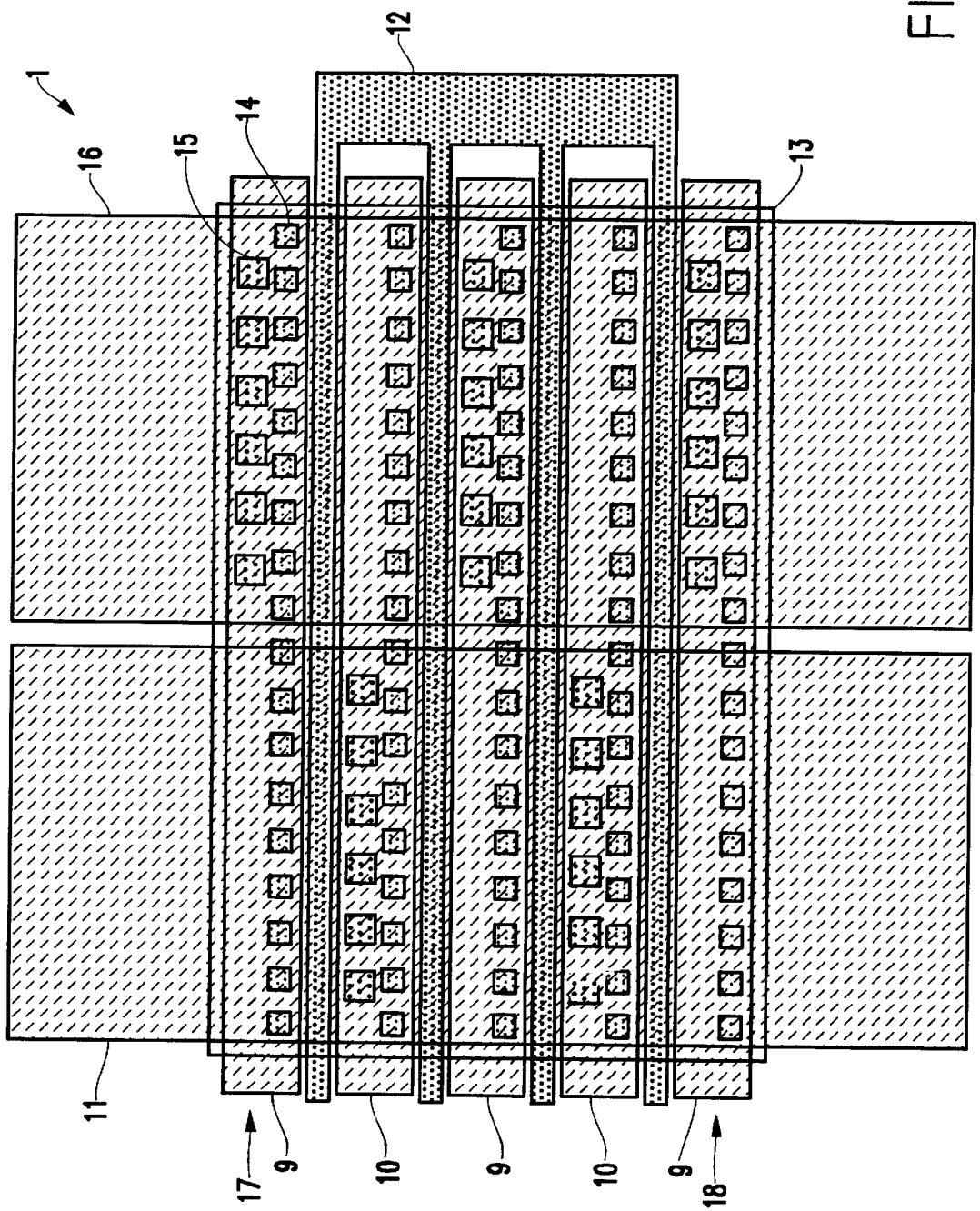
FIG. 1 is a schematic diagram of a conventional device.
Figure 2:
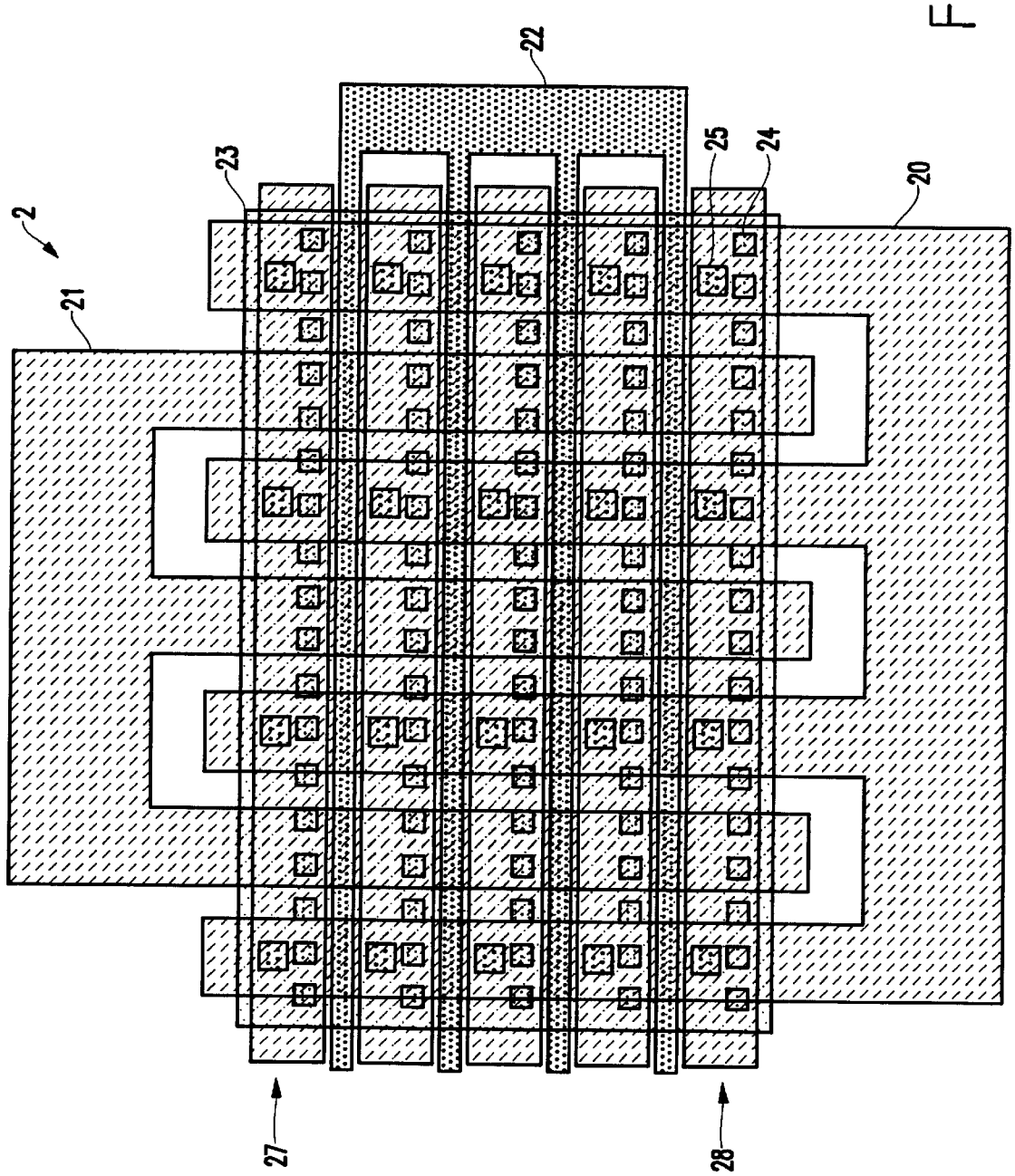
FIG. 2 is a schematic diagram of a conventional device.

In the device 3, the source diffusion (38 or 39) is chosen as the low capacitance, low resistance path up to the M2 level. This is shown as the narrow diffusion and has minimum capacitance associated with it. Here, the current feeds straight up into the M2 lead with very little lateral draw, thereby reducing overall capacitance in the device. Also, the M2 that does collect the current can be configured to encompass the full width of the device 3. These novel elements make this design excellent for electromigration reliability. The other diffusion is considered sacrificial in the sense that the M1 must be fattened extensively to handle the large lateral flow of current off to the side of the device 3. However, in most circuit designs, such as the prior art devices shown in FIGS. 1 and 2, there is usually a node, either source or drain, that does not need to be fast. Another benefit of the current device 3 is the reduction of the metal resistance.

It should be recognized that the source and the drain (38 or 39) can be interchanged in the described embodiment. While the invention has been described in terms of preferred embodiments, those skilled in the art will recognize that the invention can be practiced with modification within the spirit and scope of the appended claims.

What is claimed is:

1. A field effect transistor comprising:
   a drain comprising a first diffusion region and a first metal;
   a source comprising a second diffusion region and a second metal, wherein said source is larger in size than said drain; and
   a source connection comprising a third metal connected to said second metal,
   wherein said third metal is dimensioned to cover a substantially full width of said field effect transistor.

2. The field effect transistor of claim 1, wherein said third metal is dimensioned to cover an entire width of said field effect transistor.

3. The field effect transistor of claim 1, wherein said third metal takes current out of said source in a substantially vertical direction, wherein said vertical direction is a direction perpendicular to a plane of said second metal.

4. The field effect transistor of claim 1, wherein a current flows from said source in a substantially lateral direction, wherein said lateral direction is a direction parallel to a plane of said second metal.

5. The field effect transistor of claim 1, wherein a current flows from said drain in a substantially lateral direction, wherein said lateral direction is a direction parallel to a plane of said first metal.

6. The field effect transistor of claim 1, wherein said source further comprises a plurality of source diffusion contacts to said first metal, wherein said drain diffusion contacts are over said source only.

7. A field effect transistor comprising:
   a drain comprising a first diffusion region and a first metal;
   a source comprising a second diffusion region and a second metal, wherein said source is larger in size than said drain; and
   a source connection comprising a third metal connected to said second metal, wherein said source has a capacitance that is lower than that of said drain.

8. A MOSFET device comprising:
   a drain comprising a first diffusion region and a first metal;
   a source comprising a second diffusion region and a second metal level, wherein said source is larger in size than said drain; and
   a source connection comprising a third metal connected to said second metal,
   wherein said third metal is dimensioned to cover a substantially full width of said device.

9. The device of claim 8, wherein said third metal is dimensioned to cover an entire width of said device.

10. The device of claim 8, wherein said third metal takes current out of said source in a substantially vertical direction, wherein said vertical direction is a direction perpendicular to a plane of said second metal.

11. The device of claim 8, wherein a current flows from said source in a substantially lateral direction, wherein said lateral direction is a direction parallel to a plane of said second metal.

12. The device of claim 8, wherein a current flows from said drain in a substantially lateral direction, wherein said lateral direction is a direction parallel to a plane of said first metal.

13. The device of claim 8, wherein said source further comprises a plurality of source diffusion contacts to said first metal, wherein said drain diffusion contacts are over said source only.

14. A MOSFET device comprising:
   a drain comprising a first diffusion region and a first metal;
   a source comprising a second diffusion region and a second metal level, wherein said source is larger in size than said drain; and
   a source connection comprising a third metal connected to said second metal, wherein said source has a capacitance that is lower than that of said drain.

15. A field effect transistor comprising:

an interleaved source diffusion region and drain diffusion region;

a plurality of drain diffusion contacts to a first metal level, wherein said drain diffusion contacts are over said drain diffusion region only; and a second metal level dimensioned to cover a width of said field effect transistor, wherein said second metal level takes current out of said source region in a substantially vertical direction, wherein said vertical direction is a direction perpendicular to a plane of said second metal level.

16. A field effect transistor comprising:

an interleaved source diffusion region and drain diffusion region;

a plurality of source diffusion contacts to a first metal level, wherein said source diffusion contacts are over said source diffusion region only; and a second metal level dimensioned to cover a width of said field effect transistor, wherein said second metal level takes current out of said drain region in a substantially vertical direction, wherein said vertical direction is a direction perpendicular to a plane of said first metal level.

* * * * *